United States Patent
Hannah et al.

(10) Patent No.: US 10,001,541 B2
(45) Date of Patent: Jun. 19, 2018

(54) MAGNETOMETER AND ACCELEROMETER CALIBRATION FOR CART NAVIGATION SYSTEM

(71) Applicant: Gatekeeper Systems, Inc., Irvine, CA (US)

(72) Inventors: Stephen E. Hannah, Placentia, CA (US); Scott J. Carter, Seal Beach, CA (US)

(73) Assignee: Gatekeeper Systems, Inc., Irvine, CA (US)

(*) Notice: Subject to any disclaimer, the term of this patent is extended or adjusted under 35 U.S.C. 154(b) by 1 day.

(21) Appl. No.: 15/255,530

(22) Filed: Sep. 2, 2016

(65) Prior Publication Data

US 2017/0067981 A1 Mar. 9, 2017

Related U.S. Application Data

(60) Provisional application No. 62/214,579, filed on Sep. 4, 2015.

(51) Int. Cl.
*G01R 35/00* (2006.01)
*G01P 21/00* (2006.01)
*G01C 25/00* (2006.01)

(52) U.S. Cl.
CPC .......... *G01R 35/005* (2013.01); *G01C 25/00* (2013.01); *G01P 21/00* (2013.01)

(58) Field of Classification Search
CPC ............ G01R 31/2894; G01R 31/2853; G11C 29/022; G11C 29/816

(Continued)

(56) References Cited

U.S. PATENT DOCUMENTS 4,242,668 A 12/1980 Herzog
4,628,454 A 12/1986 Ito
(Continued)

FOREIGN PATENT DOCUMENTS

WO  WO 01/071372 A2  9/2001
WO  WO 2013/009465  1/2013
(Continued)

OTHER PUBLICATIONS

Calais, E., The Global Positioning System, Presentation Slides, Apr. 2003, available at http://web.ics.purdue.edu/~ecalais/teaching/geodesy/GPS_observables.pdf.
(Continued)

*Primary Examiner* — Giovanni Astacio-Oquendo
(74) *Attorney, Agent, or Firm* — Knobbe, Martens, Olson & Bear, LLP

(57) ABSTRACT

A wheeled object (e.g., a human-propelled cart such as a shopping cart) can include a navigation system that uses dead reckoning to determine the position of the wheeled object. The navigation system can include a magnetometer and an accelerometer and may be disposed on a handle of the wheeled object. Examples of a system for calibrating the magnetometer and accelerometer during manufacture as well as during installation on the wheeled object are disclosed. The calibration includes calibrating for the soft iron distortion induced at the navigation system by the ferromagnetic shopping cart handle (or other ferromagnetic portions of the cart such as the frame) and hard iron distortions induced by nearby magnetic sources (e.g., a permanent magnet in an audio speaker). The calibration system can include a plurality of Helmholtz or Maxwell coils.

21 Claims, 9 Drawing Sheets

(58) Field of Classification Search
USPC .................................. 324/71.11, 73.1, 76.11
See application file for complete search history.

(56) References Cited

U.S. PATENT DOCUMENTS

| | | |
|---|---|---|
| 4,949,268 A | 8/1990 | Nishikawa et al. |
| 5,119,102 A | 6/1992 | Barnard |
| 5,194,844 A | 3/1993 | Zelda |
| 5,225,842 A | 7/1993 | Brown et al. |
| 5,247,440 A | 9/1993 | Capurka et al. |
| 5,283,550 A | 2/1994 | Macintyre |
| 5,311,194 A | 5/1994 | Brown |
| 5,315,290 A | 5/1994 | Moreno et al. |
| 5,357,182 A | 10/1994 | Wolfe et al. |
| 5,379,224 A | 1/1995 | Brown et al. |
| 5,420,592 A | 5/1995 | Johnson |
| 5,438,319 A | 8/1995 | Zeytoonjian et al. |
| 5,446,656 A | 8/1995 | Koseki et al. |
| 5,598,144 A | 1/1997 | Lace |
| 5,610,586 A | 3/1997 | Zeytoonjian et al. |
| 5,638,077 A | 6/1997 | Martin |
| 5,663,734 A | 9/1997 | Krasner |
| 5,719,555 A | 2/1998 | Zeytoonjian et al. |
| 5,739,786 A | 4/1998 | Greenspan et al. |
| 5,781,156 A | 7/1998 | Krasner |
| 5,823,302 A | 10/1998 | Schweninger |
| 5,841,396 A | 11/1998 | Krasner |
| 5,868,100 A | 2/1999 | Marsh |
| 5,900,825 A | 5/1999 | Pressel et al. |
| 5,936,573 A | 8/1999 | Smith |
| 6,024,655 A | 2/2000 | Coffee |
| 6,043,748 A | 3/2000 | Touchton et al. |
| 6,054,923 A | 4/2000 | Prather et al. |
| 6,067,046 A | 5/2000 | Nichols |
| 6,097,337 A | 8/2000 | Bisio |
| 6,102,414 A | 8/2000 | Schweninger |
| 6,121,928 A | 9/2000 | Sheynblat et al. |
| 6,150,980 A | 11/2000 | Krasner |
| 6,161,849 A | 12/2000 | Schweninger |
| 6,201,497 B1 | 3/2001 | Snyder et al. |
| 6,204,772 B1 | 3/2001 | DeMay et al. |
| 6,229,478 B1 | 5/2001 | Biacs et al. |
| 6,243,648 B1 | 6/2001 | Kilfeather et al. |
| 6,249,245 B1 | 6/2001 | Watters et al. |
| 6,271,755 B1 | 8/2001 | Prather et al. |
| 6,271,757 B1 | 8/2001 | Touchton et al. |
| 6,313,786 B1 | 11/2001 | Sheynblat et al. |
| 6,415,154 B1 | 7/2002 | Wang et al. |
| 6,437,734 B1 | 8/2002 | Mcburney et al. |
| 6,446,005 B1 | 9/2002 | Bingeman et al. |
| 6,473,030 B1 | 10/2002 | Mcburney et al. |
| 6,502,669 B1 | 1/2003 | Harris |
| 6,567,041 B1 | 5/2003 | O'Dell |
| 6,603,978 B1 | 8/2003 | Carlsson et al. |
| 6,617,972 B2* | 9/2003 | Takarada ........... G08B 21/0484 |
| | | 324/538 |
| 6,693,586 B1 | 2/2004 | Walters et al. |
| 6,701,253 B2 | 3/2004 | Edwards et al. |
| 6,725,159 B2 | 4/2004 | Krasner |
| 6,859,761 B2 | 2/2005 | Bensky |
| 6,928,343 B2 | 8/2005 | Cato |
| 7,053,823 B2 | 5/2006 | Cervinka et al. |
| 7,199,709 B2 | 4/2007 | Parsons |
| 7,254,402 B2 | 8/2007 | Vayanos et al. |
| 7,463,189 B2 | 12/2008 | Bryant et al. |
| 7,616,682 B2 | 11/2009 | Small |
| 7,656,291 B2 | 2/2010 | Rochelle et al. |
| 7,658,247 B2 | 2/2010 | Carter |
| 7,880,676 B2 | 2/2011 | Ergen et al. |
| 7,918,190 B2 | 4/2011 | Belcher et al. |
| 7,944,368 B2 | 5/2011 | Carter et al. |
| 7,999,733 B2 | 8/2011 | Gronemeyer |
| 8,018,376 B2 | 9/2011 | McClure et al. |
| 8,046,160 B2 | 10/2011 | Carter et al. |
| 8,463,540 B2 | 6/2013 | Hannah et al. |
| 8,558,698 B1 | 10/2013 | Hannah et al. |
| 8,779,729 B2* | 7/2014 | Shiraishi ............. G01R 31/3606 |
| | | 320/134 |
| 8,820,447 B2 | 9/2014 | Carter et al. |
| 9,116,234 B2 | 8/2015 | Van Dierendonck et al. |
| 9,164,176 B2 | 10/2015 | Fenton |
| 9,606,238 B2 | 3/2017 | Carter |
| 9,630,639 B2 | 4/2017 | Carter et al. |
| 9,669,659 B2 | 6/2017 | McKay et al. |
| 9,731,744 B2 | 8/2017 | Carter et al. |
| 2001/0048387 A1 | 12/2001 | Sheynblat |
| 2002/0050944 A1 | 5/2002 | Sheynblat et al. |
| 2002/0178085 A1 | 11/2002 | Sorensen |
| 2002/0196151 A1 | 12/2002 | Troxler |
| 2004/0031650 A1 | 2/2004 | Taba |
| 2004/0051263 A1 | 3/2004 | Prather et al. |
| 2004/0102896 A1 | 5/2004 | Thayer et al. |
| 2004/0160365 A1 | 8/2004 | Riley et al. |
| 2004/0166873 A1 | 8/2004 | Simic et al. |
| 2005/0060069 A1 | 3/2005 | Breed et al. |
| 2005/0259240 A1 | 11/2005 | Goren |
| 2006/0082498 A1 | 4/2006 | Pitt et al. |
| 2006/0125694 A1 | 6/2006 | Dejanovic et al. |
| 2006/0244588 A1 | 11/2006 | Hannah et al. |
| 2006/0247847 A1 | 11/2006 | Carter et al. |
| 2007/0058700 A1 | 3/2007 | Fenton |
| 2007/0240903 A1 | 10/2007 | Alft et al. |
| 2008/0074260 A1 | 3/2008 | Reiner |
| 2008/0122227 A1 | 5/2008 | Hammerie |
| 2008/0158013 A1 | 7/2008 | Nebolon et al. |
| 2009/0040103 A1 | 2/2009 | Chansarkar et al. |
| 2009/0050441 A1 | 2/2009 | Wanzl |
| 2009/0322600 A1 | 12/2009 | Whitehead et al. |
| 2010/0161179 A1 | 6/2010 | McClure et al. |
| 2010/0321185 A1 | 12/2010 | Bernhard et al. |
| 2011/0211521 A1 | 9/2011 | Baba et al. |
| 2012/0098518 A1* | 4/2012 | Unagami ............. G01R 22/066 |
| | | 324/74 |
| 2012/0249325 A1 | 10/2012 | Christopher |
| 2012/0277992 A1 | 11/2012 | Pun |
| 2014/0131510 A1* | 5/2014 | Wang ................... B64C 39/024 |
| | | 244/17.23 |
| 2014/0195104 A1 | 7/2014 | Hammerschmidt |
| 2014/0232601 A1 | 8/2014 | Ische et al. |
| 2014/0306843 A1* | 10/2014 | Merkel ...................... G01S 3/14 |
| | | 342/385 |
| 2015/0177020 A1 | 6/2015 | An et al. |
| 2015/0325103 A1 | 11/2015 | Ngyuen et al. |
| 2016/0091317 A1* | 3/2016 | Friend .................. G01C 21/165 |
| | | 701/500 |
| 2016/0259061 A1 | 9/2016 | Carter |

FOREIGN PATENT DOCUMENTS

| | | |
|---|---|---|
| WO | WO 2016/144709 | 9/2016 |
| WO | WO 2017/041045 | 3/2017 |

OTHER PUBLICATIONS

Loy, Matthew, et al., "ISM-Band and Short Range Device Regulatory Compliance Overview", Texas Instruments, May 2005, in 17 pages.
Moeglein, M., et al., "An Introduction to SnapTrack Wireless-Assisted GPS Technology," in GPS Solutions, vol. 4, No. 3, Jan. 2001, pp. 16-26.
Ward, Phillip W., et al., "Chapter 5: Satellite Signal Acquisition, Tracking, and Data Demodulation," in Understanding GPS: Principles and Applications, Second Edition, E. Kaplan and C. Hegarty, Artech House, Mar. 2006, pp. 153-241.
Weston, J.L., et al., "Modern inertial navigation technology and its application", Electronics & Communication Engineering Journal, vol. 12, No. 2, Apr. 2000, pp. 49-64.
Assisted GPS, Wikipedia, accessed Apr. 11, 2016.
NAVSTAR GPS User Equipment Introduction, Sep. 1996.
NTIA, "1626.5-1660 MHz", https://www.ntia.doc.gov/files/ntia/publications/compendium/1626.50-1660.00_01SEP14.pdf, Sep. 2013, in 5 pages.

(56) References Cited

OTHER PUBLICATIONS

Afzal, Muhammad Haris, Valérie Renaudin, and Gérard Lachapelle. "Assessment of indoor magnetic field anomalies using multiple magnetometers," ION GNSS. vol. 10, Sep. 2010, pp. 1-9.

Afzal, Muhammad Haris, Valerie Renaudin, and Gerard Lachapelle, "Multi-Magnetometer Based Perturbation Mitigation for Indoor Orientation Estimation," Navigation 58.4, Aug. 2011, pp. 279-292.

Beauregard, Stéphane, and Martin Klepal. "Indoor PDR performance enhancement using minimal map information and particle filters," Position, Location and Navigation Symposium, 2008 IEEE/ION, IEEE, May 2008, pp. 141-147.

Dellaert, Frank, et al. "Monte carlo localization for mobile robots." Robotics and Automation, 1999. Proceedings. 1999 IEEE International Conference on. vol. 2. IEEE, May 1999, in 7 pages.

Gustafsson, Fredrik, et al. "Particle filters for positioning, navigation, and tracking," Report No. LiTH-ISY-R-2333, Linkopings Universitet, Sweden, Feb. 2001, in 15 pages.

Kwon, Woong, Kyung-Shik Roh, and Hak-Kyung Sung, "Particle filter-based heading estimation using magnetic compasses for mobile robot navigation," Robotics and Automation, Proceedings 2006 IEEE International Conference on Robotics and Automation. IEEE, May 2006, pp. 2705-2712.

Ozyagcilar, Talat, "Calibrating an eCompass in the Presence of Hard and Soft-Iron Interference", Freescale Semiconductor, Inc., Document No. AN4246, Apr. 2013, in 17 pages.

Ozyagcilar, Talat, "Implementing a Tilt-Compensated eCompass using Accelerometer and Magnetometer Sensors", Freescale Semiconductor, Inc., Document No. AN4248, Jan. 2012, in 21 pages.

Pedley, Mark, "Embedded Development, Electronic Compass: Tilt Compensation & Calibration", Circuit Cellar, The World's Source for Embedded Electronics Engineering Information, Issue 265, Aug. 2012, in 8 pages.

Wikipedia, "Multitaper", accessed online on Sep. 2, 2015, in 4 pages.

Wikipedia, "Welch's method", accessed online on Sep. 2, 2015, in 2 pages.

\* cited by examiner

MAGNETOMETER AND ACCELEROMETER CALIBRATION FOR CART NAVIGATION SYSTEM

CROSS-REFERENCE TO RELATED APPLICATIONS

This application claims the benefit of priority to U.S. Patent Application No. 62/214,579 filed Sep. 4, 2015, entitled "Magnetometer and Accelerometer Calibration," which is hereby incorporated by reference herein in its entirety.

BACKGROUND

Field

This disclosure is related to techniques for calibrating magnetometers and accelerometers that may be used in a navigation system to determine the position of a wheeled object such as a human-propelled cart.

Description of the Related Art

A variety of methods have been used to determine the position of a wheeled object (e.g., a human-propelled, non-motorized cart) in a tracking area. For example, a navigation system can be attached to or included in the wheeled object. The navigation system can utilize dead reckoning techniques to determine a change in the object's position based on the object's heading and speed or distance during an elapsed time interval.

SUMMARY

An embodiment of a method for calibrating a magnetometer in a navigation system for a human-propelled wheeled cart is provided. The method comprises calibrating the magnetometer prior to installation of the magnetometer in the navigation system. The calibrating comprises disposing the magnetometer at a position surrounded by a first magnetic coil; applying a time-varying current to the first magnetic coil to produce an applied magnetic field at the position of the magnetometer; measuring a magnetometer response to the applied magnetic field; and generating, based at least partly on the magnetometer response, a pre-installation calibration model for the magnetometer. The method also comprises calibrating the magnetometer after installation of the magnetometer in the navigation system and after attachment of the navigation system to a handle of the human-propelled wheeled cart. The calibration comprises disposing a second magnetic coil around the magnetometer; applying a time-varying current to the second magnetic coil to produce an applied magnetic field at the position of the magnetometer; measuring a magnetometer response to the applied magnetic field; generating, based at least partly on the magnetometer response, a post-installation calibration model for the magnetometer; and storing the pre-installation calibration model or the post-installation calibration model in a non-transitory memory in communication with the navigation system.

Another embodiment of a method for calibrating a magnetometer in a navigation system attached to a handle of a human-propelled wheeled cart is provided. The method comprises disposing a 3-axis magnetic coil system around the navigation system attached to the handle of the human-propelled wheeled cart; applying time-varying currents to the 3-axis magnetic coil system to produce an applied 3-axis magnetic field at the position of the magnetometer; measuring a magnetometer response to the applied 3-axis magnetic field; generating, based at least partly on the magnetometer response, a calibration model for the magnetometer; and storing the calibration model in a non-transitory memory in communication with the navigation system.

An embodiment of a method for calibrating a magnetometer associated with a wheeled object is provided. The method comprises disposing a magnetometer in a region surrounded by a first plurality of coils configured to generate a first magnetic field in a first direction, a second plurality of coils configured to generate a second magnetic field in a second direction, and a third plurality of coils configured to generate a third magnetic field in a third direction, each of the first, second, and third pluralities of coils configured to generate the respective first, second, and third magnetic fields in response to a first current, a second current, and a third current, respectively. The method further comprises varying each of the first current, the second current, and the third current; measuring the response of the magnetometer in response to the varied first, second, and third currents; and generating a calibration model for the response of the magnetometer.

Details of one or more implementations of the subject matter described in this specification are set forth in the accompanying drawings and the description below. Other features, aspects, and advantages will become apparent from the description, the drawings, and the claims. Neither this summary nor the following detailed description purports to define or limit the scope of the inventive subject matter.

Figure 1:
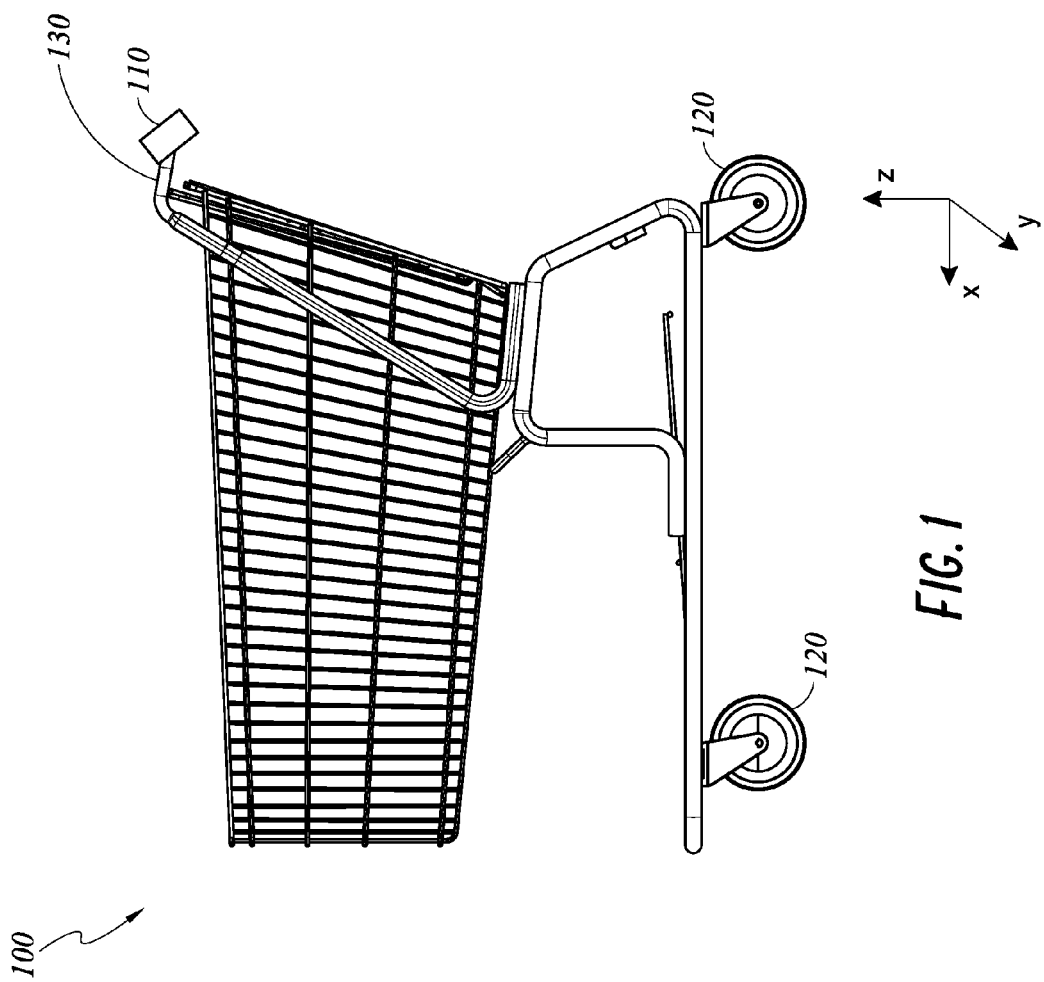
FIG. 1 shows a side view of an example of a shopping cart with a navigation system mounted on the handle of the shopping cart.

Throughout the drawings, reference numbers may be re-used to indicate correspondence between referenced elements. The drawings are provided to illustrate example embodiments described herein and are not intended to limit the scope of the disclosure.

DETAILED DESCRIPTION

Introduction

Dead reckoning navigation systems for wheeled objects can utilize magnetometers and/or accelerometers to make orientation measurements that are fed into the dead reckoning methodology for determining the position of the wheeled object. Examples of a dead reckoning navigation system for wheeled objects are described in U.S. Pat. No. 8,046,160, which is hereby incorporated by reference herein in its entirety for all it discloses. For example, a heading of a wheeled object relative to the local magnetic field can be determined using a magnetometer (e.g., a compass). An accelerometer can measure inclination of the object or deviation of the object from a straight line path.

This disclosure applies generally to any type of magnetometer and accelerometer and particularly to the situation of a three-axis magnetometer combined with a three-axis accelerometer mounted to, on, in, or near an object. In some cases, the object is a non-motorized wheeled object, for example, a human-propelled cart such as, e.g., a shopping cart, a luggage or baggage cart, a utility or warehouse cart, a wheelchair, a stroller, a hospital bed, etc. For example, in some implementations, the magnetometer and accelerometer are attached to (or incorporated into) the handle of a shopping cart, where the magnetometer plus accelerometer are used to provide a highly accurate tilt-compensated compass for purposes of dead reckoning navigation of the shopping cart's location.

Unless otherwise specified, all further references to magnetometers and accelerometers within this disclosure typically refer to three axis versions of both magnetometers and accelerometers. However, this is for purpose of illustration and is not intended to be limiting. Dead reckoning can be performed, albeit with possible reduced accuracy, with a two axis magnetometer operating in the XY (horizontal) plane and/or a two axis accelerometer operating in the XZ (vertical) plane, and the calibration techniques described herein can be applied to such magnetometer/accelerometer systems.

A shopping cart can include a wheel with a brake configured to inhibit rotation of the wheel, when the brake is actuated (e.g., by crossing a containment boundary). The dead reckoning system can be used to determine cart position as part of a cart containment system. Examples of wheel brakes, wheel/cart anti-theft systems, dead reckoning systems, and cart containment systems, usable with the magnetometer/accelerometer and calibration methods disclosed herein, are described in U.S. Pat. No. 8,046,160. In other applications, the object can be any type of apparatus, device, or structure to which the magnetometer and accelerometer is attached or mounted.

This disclosure describes examples of a system for calibrating the magnetometer and accelerometer as installed on the object. In the following examples, which are intended to illustrate and not to limit the disclosure, the object is a shopping cart. The calibration includes, in particular, calibrating the soft iron distortion induced at the magnetometer by the ferromagnetic shopping cart handle (or other ferromagnetic portions of the cart such as the frame).

FIG. 1 shows a side view of a shopping cart 100 with a navigation system 110 mounted on the handle 130 of the shopping cart. The navigation system 110 can include the magnetometer and accelerometer and a hardware processor and non-transitory memory, which include computer-executable instructions stored in the non-transitory memory, programmed to carry out, among other functions, the dead reckoning navigation methods for the cart. The navigation system 110 may be in communication (wired or wireless) with circuitry in one or more wheels 120, which may provide navigation information to the navigation system 110 (e.g., wheel rotation or wheel heading). For example, the navigation system 110 can include a radio frequency (RF) link such as Bluetooth or WiFi. The navigation system 110 can also include a power source such as batteries.

The arrangement of the navigation system 110 and cart handle 130 varies somewhat, as different shopping cart models have different handles. A coordinate system (shown in FIG. 1) is defined by the plane on which at least three of the shopping cart wheels rest, the XY plane, where the Y axis of the X plane is parallel to the line between the axle center points of the two rear wheels. The X axis is in the forward direction of motion of the cart and the Z axis is perpendicular to the X- and Y-axes and point in the upward, vertical direction (perpendicular to the surface over which the cart travels). Ideally, of course, all four wheels of the shopping cart are coplanar; in practice, bends and distortions of the shopping cart frame result in almost all cases where the wheels are not coplanar to be situations where it is one of the two front wheels which is not in contact with the ground surface. The foregoing observation is based on the standard US shopping cart design with the front wheels castered and the rear wheels fixed; it is possible that carts with all four wheels castered have a different distribution of bending.

Figure 2:
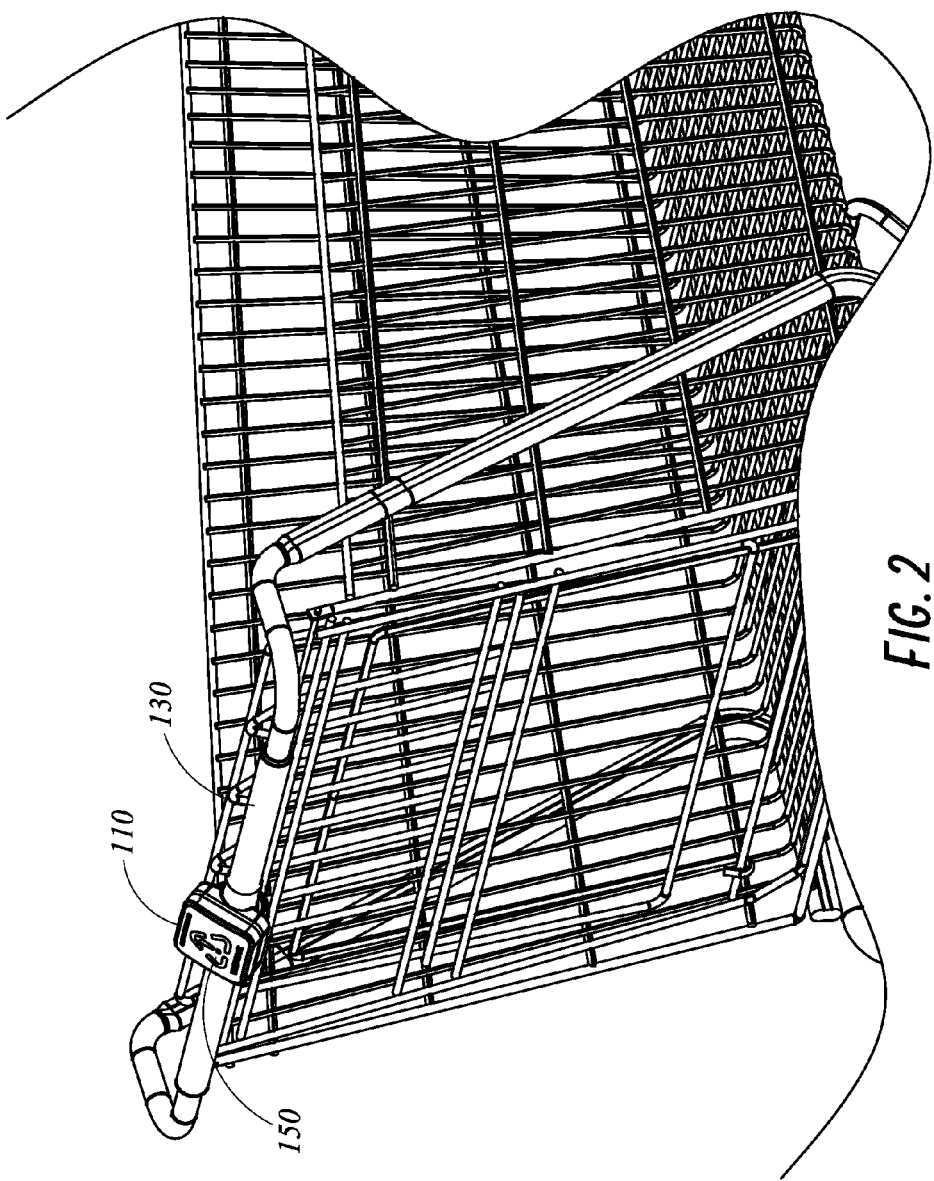
FIG. 2 is a perspective view showing an example of a navigation system mounted to a shopping cart handle.

A representative perspective view of an example of a navigation system 110 mounted to a shopping cart handle 130 is shown in FIG. 2. The navigation system 110 can include the magnetometer and accelerometer and circuitry for performing dead reckoning techniques using input from the magnetometer and accelerometer. In other embodiments, the magnetometer and accelerometer can be disposed in other places in or on the cart or in or on a wheel of the cart and be configured to communicate with the navigation system (e.g., via wired or wireless techniques). The navigation system can include a display 150 that displays information to the cart user. For example, in FIG. 2, the display 150 shows a warning that a cart wheel is about to lock to prevent removal of the cart from an authorized area.

Figure 3:
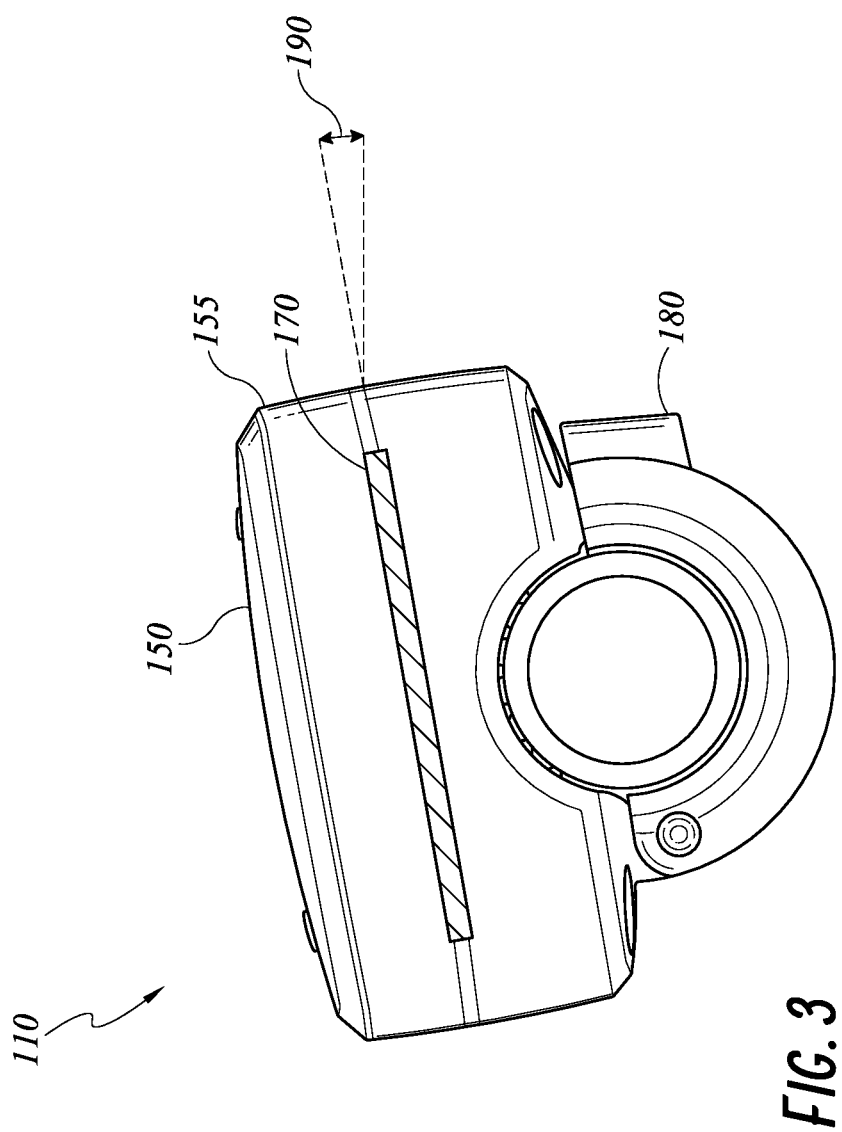
FIG. 3 is a side view showing another example of a navigation system configured to be mounted to a shopping cart handle.

A side view of an example of the navigation system 110 is shown in FIG. 3. The navigation system 110 includes a printed circuit board assembly (PCBA) 170 disposed inside an enclosure 155 (e.g., to protect the PCBA from the weather) and a locking clip 180 that permits the navigation system 110 to be mounted to the cart handle 130. The magnetometer and accelerometer may be mounted on or incorporated into the PCBA. Note that plane of the PCBA 170 in the navigation system 110 is tilted with respect to the horizontal by an angle of rotation 190 (roughly ten degrees in this example) to improve the visibility of the navigation system's display 150 to the user (the person pushing the cart). The angle of rotation 190 of the navigation system 110 about the cart handle 130 may vary substantially, e.g., be in a range from about zero degrees to about 30 degrees or up 45 degrees. In some implementations, the display 150 may be roughly face-on to the user and the angle 190 may be up to about 90 degrees. In addition, while some examples of shopping cart handles may be nominally horizontal in their center sections, it is not unusual for a section of the handle to be bent several degrees from horizontal from use or abuse of the cart. Thus, the navigation system PCBA as mounted (and the associated magnetometer and accelerometer mounted to the PCBA) are in general rotated through two different angles with respect to horizontal: 1) a rotation of the handle itself relative to a line drawn between the two rear wheel axles; and 2) a rotation of the navigation system about the handle centerline.

Alternative methods of rigidly securing the navigation system 110 to the shopping cart frame can be used; for example, in some cases the shopping cart handles are pre-drilled by the shopping cart manufacturer to facilitate attaching of objects such as a navigation system to the handle. For the purposes of this disclosure, the following calibration techniques are used, because the magnetometer is located sufficiently close to the shopping cart handle that calibration of the soft iron compensation matrix can be advantageous to achieve sufficient navigation accuracy.

Example Procedures for Hard and Soft Iron Calibration

Magnetic measurements will be subjected to distortions, which are generally considered to fall in one of two categories: hard iron or soft iron. Hard iron distortions are created by objects that produce a magnetic field (e.g., have a permanent magnetic moment). A piece of magnetized iron or an audio speaker (containing a permanent magnet) near the magnetometer will cause a hard iron distortion. If the piece of magnetic material is physically attached to the same reference frame as the magnetometer, then this type of hard iron distortion can cause a permanent bias in the magnetometer output. Soft iron distortions are considered deflections or alterations of the existing local magnetic field, typically caused by materials without a permanent magnetic moment but which magnetize in the presence of a magnetic field (e.g., the geomagnetic field or hard iron fields). These distortions can stretch or distort the magnetic field depending upon which direction the local field acts relative to the magnetometer. This soft iron type of distortion may be caused by ferromagnetic materials such as nickel and iron and steel near the magnetometer. For example, human-propelled carts (e.g., shopping carts) often have frames and handles comprising ferromagnetic material (e.g., mild steel), whose residual magnetization can change over time (e.g., if a cart is stored over a long period of time in a particular orientation, the magnetic domains will slowly align in accordance with the magnetic field the cart experiences). The changing magnetization of the cart can cause errors in the estimated heading from the magnetometer, because the magnetic field being measured by the magnetometer is different from the geomagnetic field.

One possible procedure for accurately calibrating a three axis magnetometer for hard and soft iron distortion (e.g., to perform the function of a tilt compensated compass in a smartphone) utilizes rotating the magnetometer multiple times about all three axes, ideally covering as many possible three-dimensional (3D) orientations of the magnetometer relative to the local geomagnetic field. Those (magnetometer) values are fit to a model to produce a soft iron correction matrix. A summary of a standard procedure can be found in Freescale Semiconductor (Austin, Tex.) Application Note AN4246, Rev. 3, April 2013, entitled "Calibrating an eCompass in the Presence of Hard and Soft-Iron Interference", with particular emphasis on section 5 of that application note.

The approach described in Freescale Semiconductor Application Note AN4246 may not be especially practical for a magnetometer mounted to the handle of a shopping cart: human factor constraints on the desirable size and mounting of the navigation system result in the magnetometer chip generally being within 4 cm or less of the nearest point of the shopping cart handle. The handle is usually constructed of mild steel tubing, which produces a substantial soft iron effect. The soft iron effect is sufficiently variable between different shopping carts that a single mathematical model of the soft iron distortion to fit all shopping carts to sufficient accuracy cannot be practically developed. To rotate the entire shopping cart (including the mounted navigation system) across all three axes for soft iron calibration is not practical (e.g., carts are easily rotated only about the vertical Z axis). In addition, in some cases the navigation system may also contain a speaker as part of notification system to warn the cart user that a cart wheel is about to lock, and the speaker can include a permanent magnet that can modify the local magnetic field.

Thus, the example approaches described in the present disclosure are preferred alternatives. The general approach can be summed up by the following operations.

(1) Calibrate the magnetometer after PCBA manufacture, by using a fixture which can produce a desired magnetic field (typically, both magnitude and direction) at the magnetometer. This calibration can then advantageously produce a highly accurate nonlinear model of the response of each magnetometer axis. An example manufacturing calibration system is described with reference to FIG. 4. This manufacturing calibration is typically only performed once, at the PCBA manufacturing facility or a facility manufacturing or assembling the navigation system 110.

(2) After the navigation system 110 is fixed to the cart handle 130, such that the location and orientation of the navigation system with respect to the cart handle will not (appreciably) change, encircle the navigation system with a calibration apparatus which is capable of producing a desired magnetic field (typically, both magnitude and direction) at the mounted magnetometer, while also producing a substantially similar magnetic field in the portion of the cart handle nearest to the magnetometer. An example installation calibration system is described with reference to FIGS. 5 and 6. This installation calibration technique is typically performed at the facility where the navigation system and cart are located (e.g., a retail store or warehouse) and can be performed periodically (e.g., daily, weekly, monthly) or as needed (e.g., when the dead reckoning results have become inaccurate).

(1) Example Calibration During PCBA Manufacture

During manufacture of the navigation system 110, the PCBA 170, which contains the magnetometer and accelerometer chip(s), can be placed in the center of a three-axis Helmholtz coil array, such that the magnetometer is at or near the center of the coils in all three axes. The three-axis Helmholtz coil array may include one or more Helmholtz coils for each of the three axes. Generally, a Helmholtz coil comprises two wire coils (e.g., solenoids) on the same axis and is configured to produce a substantially uniform magnetic field in a region near the center between the two coils. In other implementations, Maxwell coils (which may include three coils oriented on a surface of a virtual sphere so as to provide a more uniform magnetic field than a Helmholtz coil) can be used alternatively or additionally to the Helmholtz coils.

A fixture to hold the PCBA can be used to ensure that the orientation of the PCBA (and thereby the magnetometer chip) is fixed relative to the Helmholtz coil array. An example 3 axis Helmholtz coil array is the SpinCoil-7-9-11-XYZ from Micro Magnetics, Inc. (Fall River, Mass.).

The ambient magnetic field vector $B_m$ at the location of manufacture can be measured and will generally be fairly stable over time, although steel structure in the building containing the manufacturing location may result in the magnetic field being substantially different from the geomagnetic field $B_G$ at the same location.

By separately adjusting the three currents of the three Helmholtz coils $I_x$, $I_y$, $I_z$ any desired field can be produced at the magnetometer location. In practice the highest static magnetic field strength that will be seen at the magnetometer in field use (for shopping carts) is on the order of 100 µT (e.g., about 65 µT from the geomagnetic field, plus amplification from soft iron); allowing for cancelling the ambient magnetic field results in a maximum field strength required from the Helmholtz coil array of about 150 µT in some implementations. Other field strengths can be used if the expected magnetic field experienced by the magnetometer is different from the foregoing values.

Figure 4:
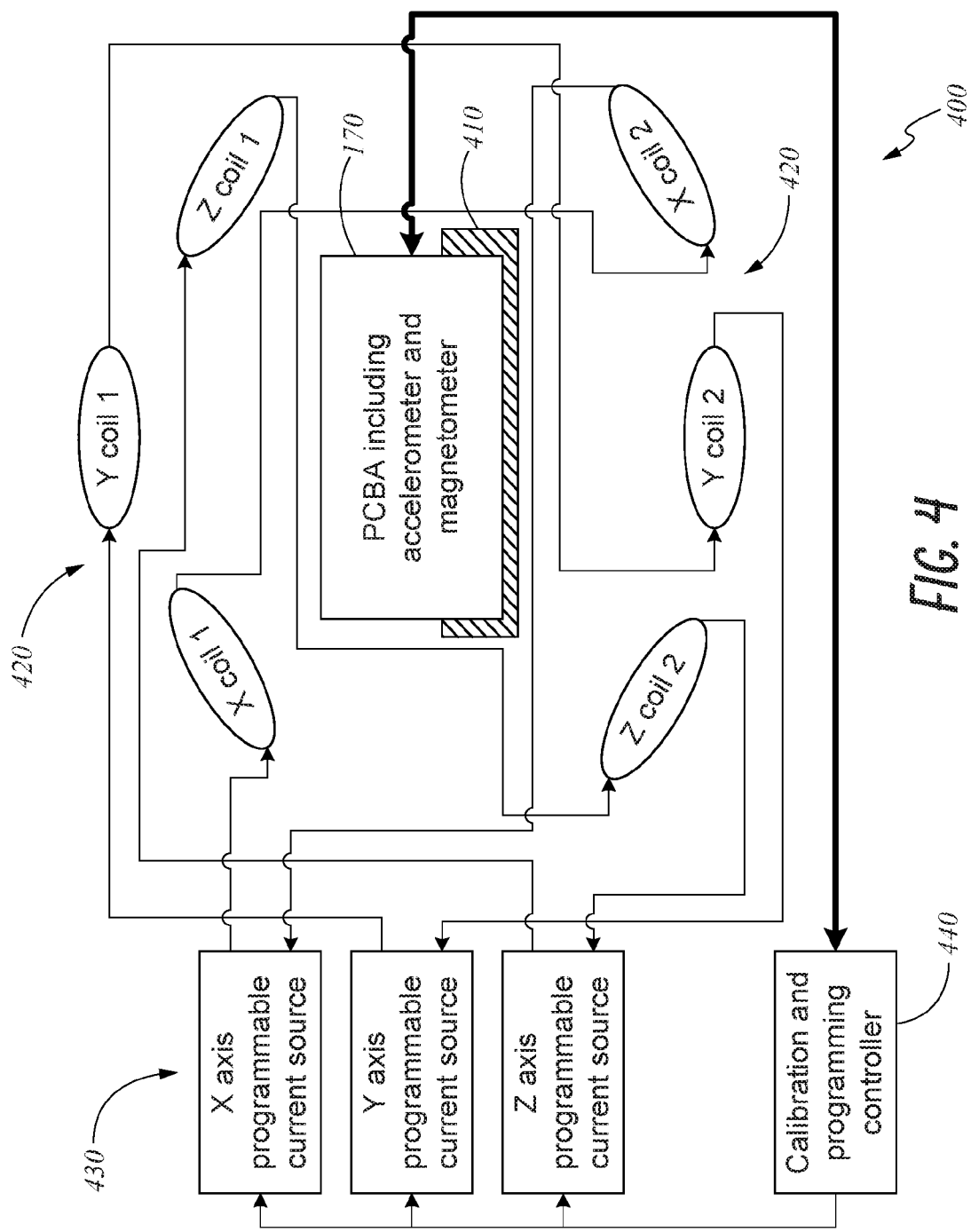
FIG. 4 is a block diagram that shows an example of an architecture of a manufacturing calibration system.

FIG. 4 is a block diagram that shows an example of architecture of the manufacturing calibration system 400. The navigation system PCBA 170 can be placed into an orientation fixture 410 (which can be constructed from non-magnetic material, for example, aluminum) such that the magnetometer is located at or near the center of the coil array 420 and the PCBA 170 is horizontal and in a known X-Y (horizontal plane) relationship to the coil array 420. The coil array 420 can comprise a plurality of Helmholtz or Maxwell coils. FIG. 4 schematically illustrates 3 pairs of coils for the X, Y, and Z direction calibration.

The arrows on the connections between the coils indicate that in a Helmholtz coil array 420, two coils on a given axis can have the same current, and that the current is fed such that the direction of current circulation is the same in both coils. The orientation system 400 includes programmable current sources 430 for providing current to the coils of the coil array 420. The programmable current sources can be capable of producing both positive and negative currents with respect to their output connections; alternatively a single ended current source can be used with an H-bridge to change the current direction. A controller 440 can control the calibration operation and can communicate with the navigation system 110 via a standard wired interface such as a universal serial bus (USB) and/or serial or can use a wireless connection. Note also that one representative navigation system PCBA 170 includes a single package (e.g., Freescale Semiconductor FXOS8700 digital sensor—3D accelerometer and 3D magnetometer) containing both a three axis magnetometer and a three axis accelerometer. Other implementations can use different magnetometers and accelerometers, possibly in two different packages (e.g., a MEMSIC MMC3316xMT three axis magnetometer and a Rohm Kionix KX123 three axis accelerometer). Other choices for the magnetometer/accelerometer include a Kionix KMX62-1031 tri-axis magnetometer and accelerometer. The PCBA 170 can include a microcontroller such as an Atmel ATSAMG55J19A microcontroller.

It is desirable (though not required) that the PCBA orientation system 400 be designed such that the fixture 410 holding the PCBA 170 can be placed in six different attitudes, with the X, Y, and Z axes of the accelerometer respectively up (most positive) and down (most negative) in one of the six attitudes. This provides for a linear calibration of the accelerometer (offset and gain on each axis, plus estimated cross-axis). If a particular model of accelerometer is determined by testing to suffer from significant, unit specific nonlinearity, where significant nonlinearity is defined based on the error in the compass horizontal component induced by the accelerometer nonlinearity, then the PCBA orientation fixture can be made to support additional angles, e.g., 45 degree angles to the orthogonal planes, to provide data for calibration of the three-axis accelerometer according to, e.g., a parabolic interpolation.

For some applications it may be desirable to calibrate the magnetometer over a greater range of magnetic field strength than the largest static field that will be seen in field use. If a magnetometer will experience an alternating current (AC) magnetic field whose magnitude significantly exceeds the previously mentioned 100 µT example, e.g. because of being located close to a high current AC power line, and if the magnetometer can experience significantly different nonlinearities at those higher field strengths (e.g., significantly different from the extrapolation of nonlinearities measured at field strengths up to about 100 µT), then an extended magnetic field calibration range (up to the highest expected AC field strength) can be used. The extended calibration range will make it possible to linearize the magnetometer response at those higher AC field strengths and in turn allow a digital filter (e.g., notch and/or low pass) to be effectively applied to the linearized magnetometer readings to remove the AC component of the magnetic field experienced by the magnetometer (e.g., 50/60 Hz power line fields). Such embodiments can produce a more accurate low frequency value of magnetic field strength and direction, and from the more accurate magnetic field values, a more accurate heading estimate for the shopping cart and more accurate dead reckoning can be determined.

A manufacturing calibration model of the response of the magnetometer can be determined from the magnetometer readings as the magnetic fields are varied in the coils of the coil array 420 (e.g., by changing the currents $I_x, I_y, I_z$). The calibration model can be used by the navigation system to correct magnetic field measurements made by the magnetometer during field use. For example, the calibration model can be stored as a look up table (LUT) in a non-transitory memory accessible by the navigation system. The calibration model can be nonlinear (or linear in some embodiments).

Although a multi-axis magnetic coil calibration system can generate the calibration model more quickly, in other embodiments, a single coil is applied sequentially to each of the three axes to determine calibrations for each axis sequentially.

(2) Example Calibration During Installation

After the navigation system 110 has been affixed to the cart handle 130 (e.g., as shown in FIG. 2), an installation calibration system 500 can be used to calibrate the navigation system 110. The system can include a fixture 510 that can be attached to or disposed near or surrounding the navigation system 110 on the cart handle 130. The installation calibration fixture 510 can include a plurality (e.g., three) coil arrays 520 arranged about the navigation system 110. The coil arrays 520 can comprise Helmholtz or Maxwell coils. The installation calibration fixture can be disposed such that the navigation system 110 is near the center of the coil arrays 520.

The installation calibration system 500 can be generally similar to the manufacturing calibration system 400 described herein with reference to FIG. 4. However, the mechanical constraints produced by the cart handle 130 running through the navigation system mounting lock 180 (see, e.g., FIG. 2), plus the desire for the installation calibration fixture 510 to be substantially more rugged (due to its use in the field at retail facilities), may result in a somewhat different implementation. In particular, the magnetic field source for the plane parallel to the cart handle is, in some cases, implemented using a Maxwell coil arrangement rather than a Helmholtz coil arrangement. The Maxwell coil is substantially smaller in its bounding dimensions than a Helmholtz coil, given that the Helmholtz coil would have to clear the navigation system enclosure. Also, a Maxwell coil arrangement has a larger region (as a fraction of the size of the bounding sphere of the coil arrangement) with a given level of homogeneity in the magnetic field than a Helmholtz coil arrangement. The example implementation in this disclosure disposes the Maxwell coil arrangement such that the axis of the Maxwell coil is normal to the axis of the shopping cart handle 130, thus achieving the desirable result that the imposed field at the nearer parts of the handle (which contribute the most to the soft iron distortion) is very similar to the imposed field at the magnetometer itself, to a much greater degree than if that axis were a Helmholtz coil of similar dimension.

Figure 5:
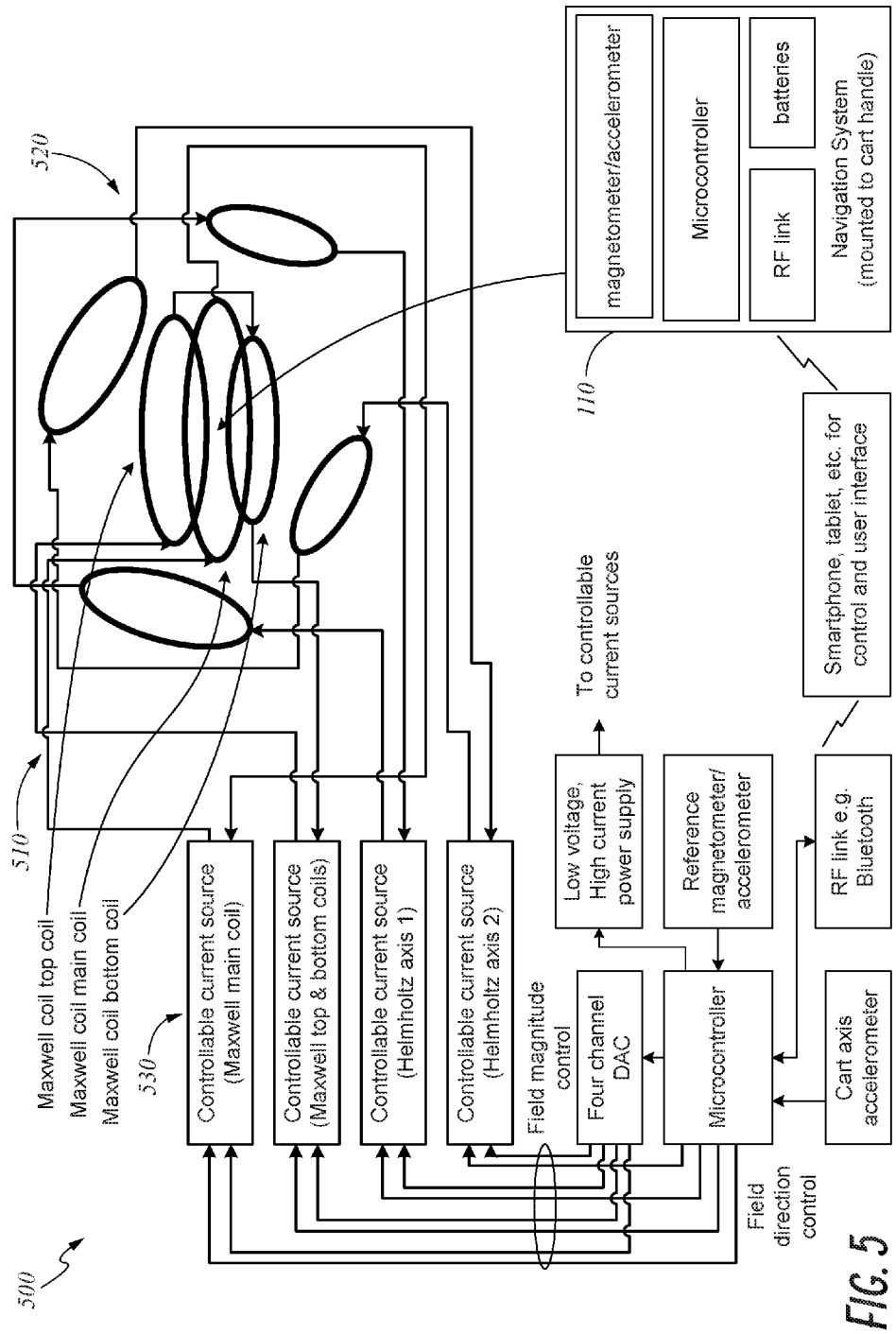
FIG. 5 is a block diagram that shows an example of an architecture of an installation calibration system.

A block diagram of a representative installation calibration system 500 is shown in FIG. 5. This particular design contains one Maxwell coil arrangement and two Helmholtz coil arrangements for the three axes of magnetic field generation needed. Other implementations can use Maxwell coil arrangements for two or even all three axes—in general, implementations using Maxwell coils for multiple axes will be somewhat more complex and probably more expensive than equivalent Helmholtz coil arrangements, but on the other hand Maxwell coils may be physically smaller and therefore more convenient to use for installation operations.

An installation calibration model of the response of the magnetometer can be determined from the magnetometer readings as the magnetic fields are varied in the Maxwell or Helmholtz coils (e.g., by changing the currents $I_x$ $I_y$ $I_z$ provided by controllable current sources 530). The calibration model can be used by the navigation system to correct magnetic field measurements made by the magnetometer during field use. For example, the calibration model can be stored as a look up table (LUT) in a non-transitory memory accessible by the navigation system. The calibration model can be nonlinear (or linear in some embodiments).

Although a multi-axis magnetic coil calibration system can generate the calibration model more quickly, in other embodiments, a single coil is applied sequentially to each of the three axes to determine calibrations for each axis sequentially.

(3) Example Electromechanical Implementation of Installation Calibration Coils

Figure 6A:
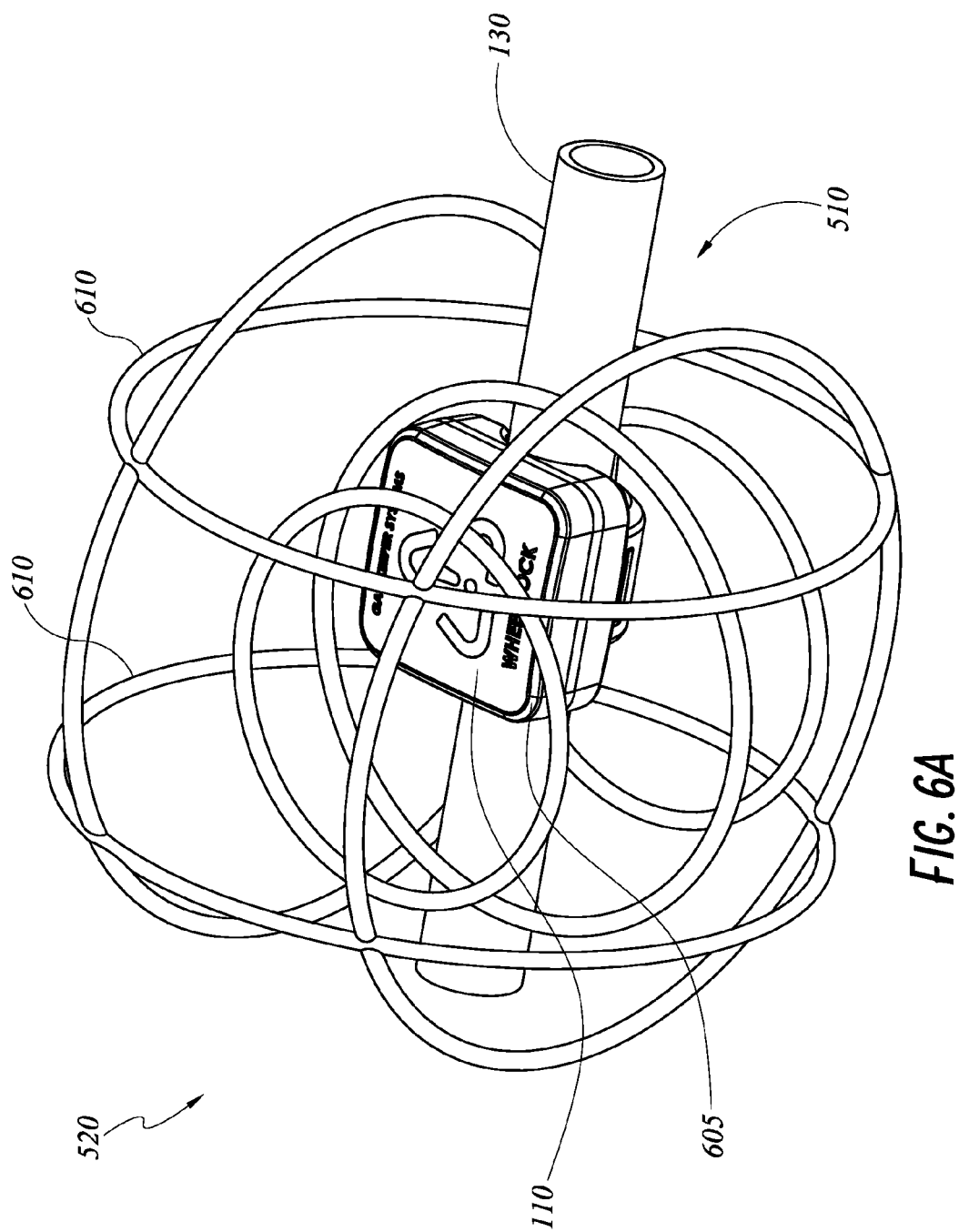
FIG. 6A is a three dimensional (3D) perspective view of an example arrangement of coils around a navigation system attached to a handle of a cart.

A perspective 3D model of an example arrangement of coils of the coil array 520 relative to a navigation system 110 on a cart handle 130 is shown in FIG. 6A. Note that the magnetometer in this example is placed toward a corner 605 of the navigation system enclosure 155, as far away from the cart handle 130 as possible without increasing the enclosure size (and also as far away from steel jacketed navigation system batteries which are located inside the enclosure; the batteries are not shown in FIG. 6A), thus reducing or minimizing the magnitude of hard and soft iron distortion at the magnetometer due to the handle (and due to the batteries or a speaker, if used). For example, the magnetometer can be inside the enclosure 155 near a corner or near a join between upper and lower portions of the enclosure.

Figure 6B:
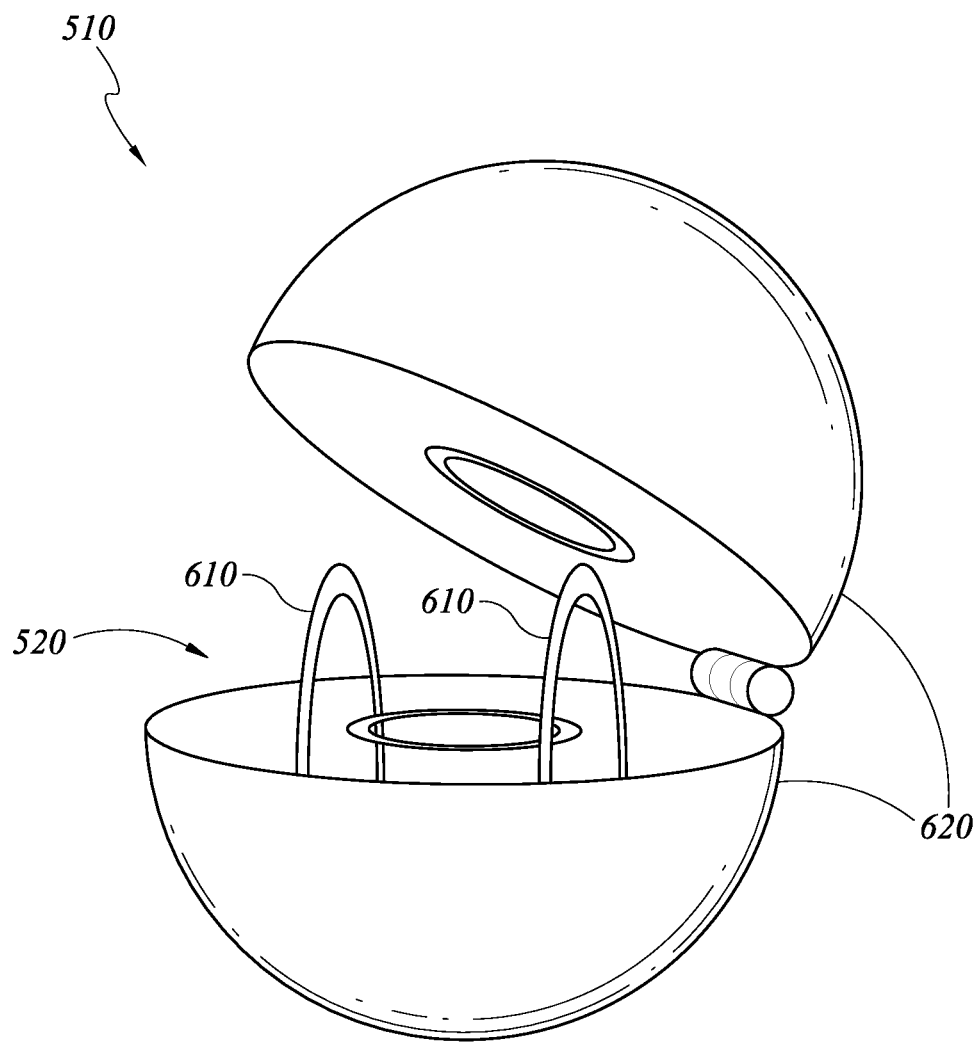
FIG. 6B shows an example of an installation calibration fixture comprising a clamshell for orienting a magnetic coil array around a navigation system mounted to a handle of a cart.

FIG. 6B shows an example of an installation calibration fixture 510 comprising a clamshell 620 for orienting the magnetic coil array 520 around a navigation system 110 mounted to a handle 130 of a cart. The coils can be held in the correct orientation by features in the two piece clamshell 620 (e.g., the clamshell 620 comprising two molded plastic parts designed to fit around the navigation system 110 and the handle 130) which also contains orientation features sized to the corners of the navigation system enclosure 155. Thus, as the clamshell 620 is closed around the mounted navigation system 110, all three coil arrangements are locked into the correct orientation relative to the magnetometer. The clamshell design advantageously allows the installation calibration fixture 510 to be readily mounted to (and removed from) a cart handle on a cart in the field (e.g., in a retail or warehouse environment) so as to position the navigation system properly within the coil arrays.

In some implementations, two coils 610 as indicated in FIG. 6 may be designed to break apart to clear the shopping cart handle 130, which is non-removable from the cart in this example. While the coils of the coil array 520 are shown here as conventional tori (to simplify the presentation of how the different axes of field generation coils behave as standard Maxwell and Helmholtz coils), the actual implementation may be different to provide the break apart capability. One implementation of such a break-apart is for each half of the torus (note that the two halves of the torus are not necessarily symmetric) to implement the current carrying elements using a flexible printed circuit, with connectors mating to complete the circuit when the two halves are mated. Another possible solution is to have the coils be single turn, at which point the coil halves are simply a formed arc of conductor.

The current needed to produce a field of magnitude B (e.g., up to about 150 μT) can be estimated as follows. As is well known, the magnitude of the magnetic field B at the center of a Helmholtz coil is (where $\mu_0$ is the permeability of free space, n is the number of turns of coil, I is the current in the coils, and R is the radius of the coils) is:

$$B = \left(\frac{8}{5\sqrt{5}}\right)\frac{\mu_0 n I}{R}$$

This can be rearranged for n=1 to yield a formula for the current to be used in the coil:

$$I = \left(\frac{5\sqrt{5}}{8}\right)\frac{R}{\mu_0}B$$

For B=150 μT this formula gives a current of roughly 166 amperes/meter of radius.

The coils 610 in the example shown in FIG. 6 have a radius of about 15 cm (this radius is derived from the roughly 7.5 cm dimension of the navigation system enclosure), yielding a current on the order of 25 amperes to generate a 150 μT field. A 25 ampere current can be carried by single spring-loaded blind mating contacts (known in the electronics manufacturing industry as "pogo pins"); for example, the model SH-5 probe and receptacle from Interconnect Devices, Inc., which is rated for 39 amperes.

Determining Orientation of the Navigation System Relative to Cart Body Frame

As noted in above, the shopping cart handle 130 is not necessarily horizontal to the dead reckoning coordinate system. For increased or optimal accuracy of the dead reckoning process, it is desirable that the angles of the navigation system's PCBA coordinate system with respect to the cart body frame coordinate system be known.

To determine the angles in question, one approach is to create an alignment fixture 700 which attaches to both rear wheel axles of the cart, and which establishes the local horizontal. The alignment fixture 700 can include an expanding tube 710 with an internal spring, containing features which align to the nuts on the inside of the rear wheel axles, as shown in the perspective view of FIG. 7A can be used to establish the Y axis orientation of the cart frame. A small flat surface—e.g., a bottom of a triangular block 715 pivoting about the expanding tube 710 is shown in FIG. 7B and establishes the local level of the horizontal reference for the X axis. A 3-axis accelerometer mounted to the triangular block 715 (or the expanding tube 710) and connected (either via a cable 705 as shown, or via Bluetooth or wireless (e.g., radio frequency (RF) link) to the main installation calibration fixture 510) provides a reference for the cart's XYZ frame relative to gravity. Such a fixture is indicated by the block labeled "Cart axis accelerometer" in FIG. 5.

Figure 7A:
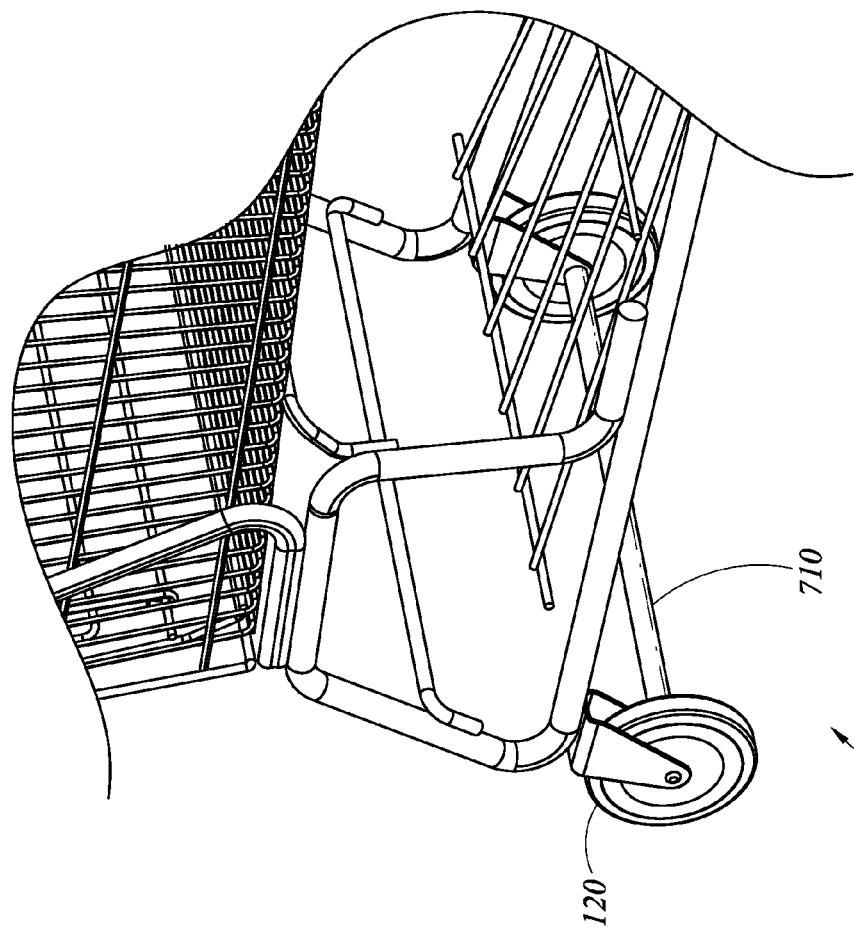
FIGS. 7A and 7B show an example of an alignment fixture (perspective view in FIG. 7A, plan view in FIG. 7B).
Figure 7B:
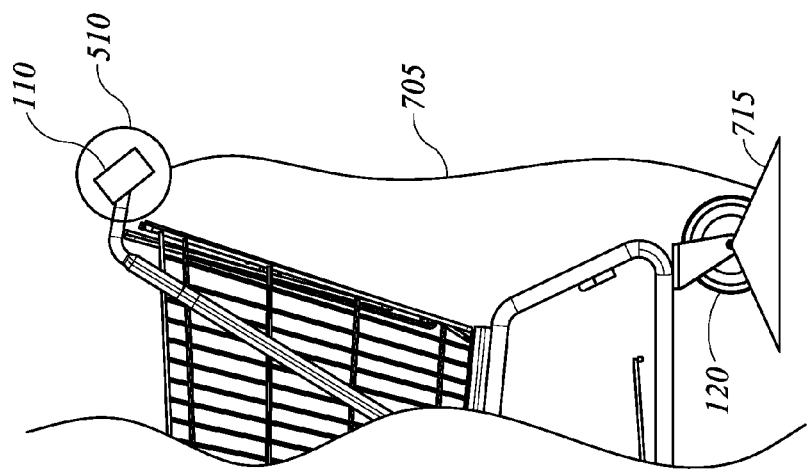

It can be seen from FIGS. 7A-7B that the difference between the orientation reported by the 3-axis accelerometer in the navigation system 110 and the orientation reported by the 3-axis accelerometer in the cart axis alignment fixture 700 is the orientation of the navigation system's accelerometer/magnetometer.

Additional Observations Regarding Calibration

Non-Orthogonal Coils

The orthogonal arrangement of coils in the example coil array 520 shown in FIG. 6 simplifies the task of producing a magnetic field of a given strength and direction. For example, the calibration technique can decompose the desired magnetic field into its three orthogonal components along the three axes of the coil arrangements, and from the desired magnetic field components, the required currents can be calculated according to the well-known equations for field strength in a Helmholtz coil and/or a Maxwell coil. However, mechanical constraints related to the handle and other cart elements close to the handle may make it impractical (or in some cases physically impractical) to obtain three orthogonal axes.

Given that the coil angles are known, and that the target magnetometer is close enough to the center point of all three coil axes, the required field strengths (and thus current) from three non-orthogonal coils can be calculated by solving the system of linear equations:

$$Ax=b$$

giving $$x=A^{-1}b$$

In the foregoing equations, A is a 3×3 matrix of the orthogonal components of magnetic field produced per unit current at the target magnetometer by each coil axis (e.g., a direction cosine matrix), b is the desired magnetic field vector, and x is an unknown vector of currents to be controlled on each coil axis (this treats a Maxwell coil arrangement as a single coil axis).

However, a severely non-orthogonal coil arrangement may require significantly greater current-turn products to produce the same field vector at the target magnetometer, and may typically also have a smaller volume surrounding the magnetometer in which the field is effectively constant (e.g., uniform or homogeneous). It is possible that in some cases it may be preferable to have four coil axes rather than three, as less field cancellation (and thus lower supply currents and larger homogenous regions) can result from the four coil axes. Having using four partially independent coil axes to produce three orthogonal field components may result in multiple solutions for the under-constrained linear system. An optimal solution under side constraints can be used to provide a solution: for example, the method of Lagrange multipliers, with the function to be minimized being the maximum current across any one coil axis.

Example Current Control Circuits

Figure 8:
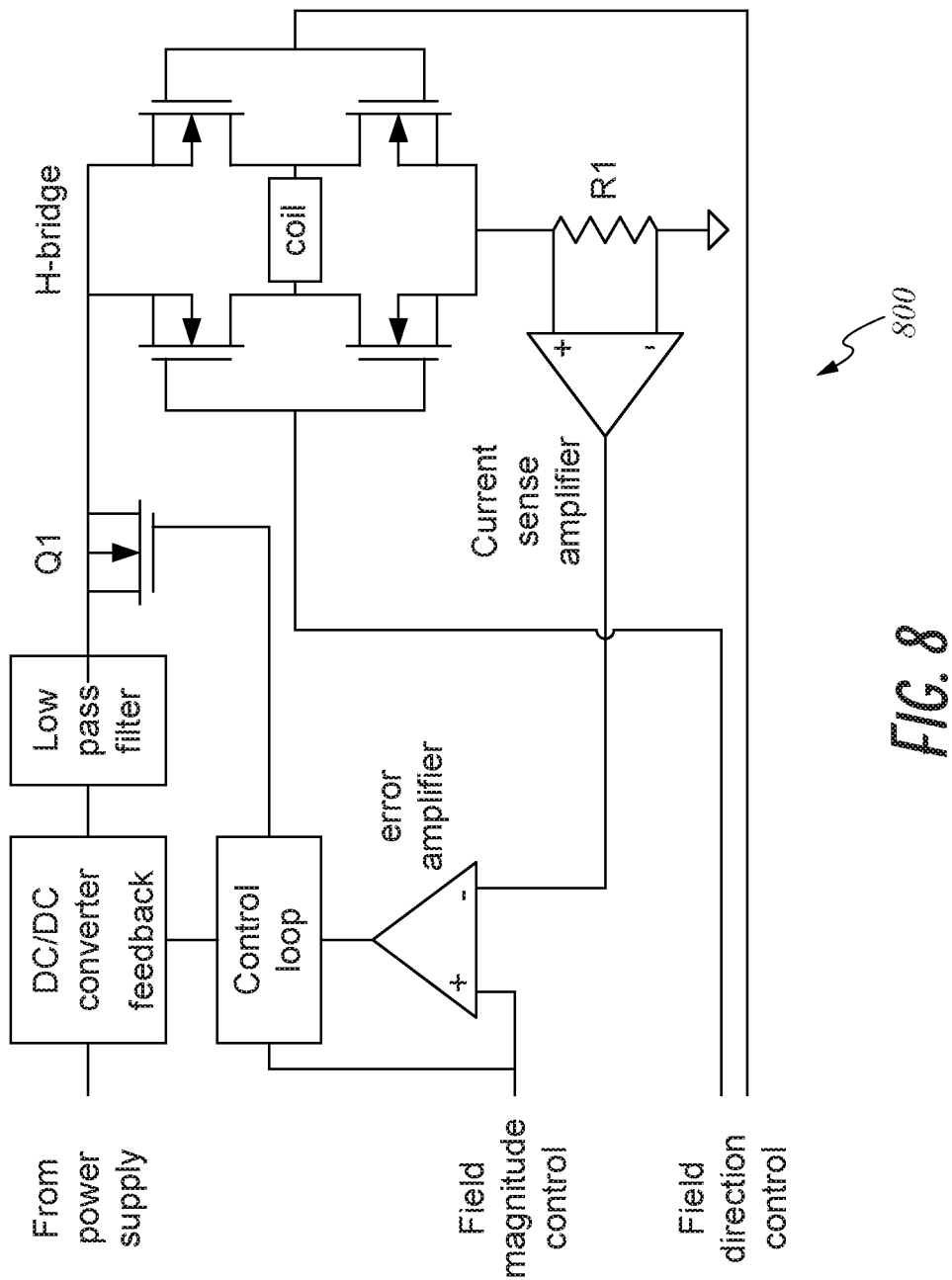
FIG. 8 shows an example of a single channel implementation of a current control circuit, which may be suitable for controlling current in a Helmholtz coil.

The controllable current sources 430, 530 shown in FIG. 4 or 5 can be implemented with a feedback loop around a current sense amplifier and an H-bridge for directional switching. FIG. 8 shows an example of a single channel implementation of a current control circuit 800 (e.g., suitable for a Helmholtz coil) that can be used as a controllable current source 430, 530. A Maxwell coil version could use two channels, one channel for the center coil and one channel for the auxiliary coils.

In the circuit 800, a direct current (DC) DC/DC converter can be an integrated non-isolated Point Of Load (POL) converter such as the OKDx-T/40-W12, available from Murata Power Solutions (Smyrna, Ga.). Transistor Q1 is driven to saturation in most cases, but for relatively low output currents, typically less than one ampere, the total voltage drop across Q1, the H-bridge, and the coil itself will be less than the minimum stable output voltage, which is for example 0.6 V for the OKDx-T/40-W12. In those cases the transistor Q1 will be desaturated to the degree necessary to provide the required voltage drop.

The H-bridge can be made more efficient if it is constructed entirely from N-channel MOSFETs (rather than using P-channel MOSFETs for the top half of the H-bridge as shown in FIG. 8), which may require a higher voltage (e.g., a charge pump) for their gate drive.

Algorithmic Improvements

There may also be some improvement in the accuracy of the hard iron and soft iron calibration by taking advantage of the fact that the major source of distortion (e.g., the cart handle, assuming, as is usually the case, that the cart handle is made of mild steel or some other ferromagnetic alloy) is in a known geometric relationship to the magnetometer. By modeling the shopping cart handle 130 as a tube of known diameter, length, and magnetic softness, but of unknown thickness and magnetic remanence, a best fit of the 3D response of the target magnetometer to various applied fields allows an improved model of the soft iron environment compared to the conventional linear response matrix (such as described in Freescale Application Note AN4246), and thus a much more accurate soft iron correction to the operational magnetometer reading.

Additional Information

The various illustrative logical blocks, modules, and processes described herein may be implemented or performed by a machine, such as a computer, a processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor may be a microprocessor, a controller, microcontroller, state machine, combinations of the same, or the like. A processor may also be implemented as a combination of computing devices, e.g., a combination of a DSP and a microprocessor, a plurality of microprocessors or processor cores, one or more graphics or stream processors, one or more microprocessors in conjunction with a DSP, or any other such configuration.

Depending on the embodiment, certain acts, events, or functions of any of the processes or methods described herein can be performed in a different sequence, may be added, merged, or left out altogether. Thus, in certain embodiments, not all described acts or events are necessary for the practice of the processes. Moreover, in certain embodiments, acts or events may be performed concurrently rather than sequentially. In any apparatus, system, or method, no element or act is necessary or indispensable to all embodiments, and the disclosed apparatus, systems, and methods can be arranged differently than shown or described. No single element or group of elements is necessary or required in all embodiments of the systems, fixtures, apparatus, and methods described herein.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present. The articles "a" or "an" or "the" when referring to an element means one or more of the element, unless the context clearly indicates otherwise.

While the above detailed description has shown, described, and pointed out novel features as applied to various embodiments, it will be understood that various omissions, substitutions, and changes in the form and details of the logical blocks, modules, and processes illustrated may be made without departing from the spirit of the disclosure. As will be recognized, certain embodiments of the inventions described herein may be embodied within a form that does not provide all of the features and benefits set forth herein, as some features may be used or practiced separately from others.

What is claimed is:

1. A method for calibrating a magnetometer in a navigation system for a human-propelled wheeled cart, the method comprising:
    calibrating the magnetometer prior to installation of the magnetometer in the navigation system, the calibrating comprising:
        disposing the magnetometer at a position surrounded by a first magnetic coil;
        applying a time-varying current to the first magnetic coil to produce an applied magnetic field at the position of the magnetometer;
        measuring a magnetometer response to the applied magnetic field; and
        generating, based at least partly on the magnetometer response, a pre-installation calibration model for the magnetometer; and
    calibrating the magnetometer after installation of the magnetometer in the navigation system and after attachment of the navigation system to a handle of the human-propelled wheeled cart, the calibration comprising:
        disposing a second magnetic coil around the magnetometer;
        applying a time-varying current to the second magnetic coil to produce an applied magnetic field at the position of the magnetometer;
        measuring a magnetometer response to the applied magnetic field;
        generating, based at least partly on the magnetometer response, a post-installation calibration model for the magnetometer; and
        storing the pre-installation calibration model or the post-installation calibration model in a non-transitory memory in communication with the navigation system.

2. The method of claim 1, further comprising installing the magnetometer in the navigation system.

3. The method of claim 1, wherein the first magnetic coil or the second magnetic coil comprises one or both of a Helmholtz coil or a Maxwell coil.

4. The method of claim 1, wherein the first magnetic coil or the second magnetic coil comprise at least three magnetic coils arranged to provide magnetic fields along three different directions, respectively.

5. The method of claim 1, further comprising determining an orientation of a coordinate system associated with the navigation system relative to an orientation of a body frame of the human-propelled, wheeled cart.

6. The method of claim 5, wherein the human-propelled, wheeled cart comprises a pair of wheels, the navigation system comprises a first accelerometer, and determining the orientation of the coordinate system associated with the navigation system relative to the orientation of the body frame of the human-propelled, wheeled cart comprises:
    attaching an alignment fixture between the pair of wheels, the alignment fixture comprising a second accelerometer; and
    comparing a first measurement from the first accelerometer with a second measurement from the second accelerometer.

7. The method of claim 1, wherein applying the time-varying current to the first magnetic coil or the second magnetic coil comprises using a feedback loop, a current sense amplifier, and an H-bridge for directional switching.

8. A method for calibrating a magnetometer in a navigation system attached to a handle of a human-propelled wheeled cart, the method comprising:
    disposing a 3-axis magnetic coil system around the navigation system attached to the handle of the human-propelled wheeled cart;
    applying time-varying currents to the 3-axis magnetic coil system to produce an applied 3-axis magnetic field at the position of the magnetometer;
    measuring a magnetometer response to the applied 3-axis magnetic field;
    generating, based at least partly on the magnetometer response, a calibration model for the magnetometer; and
    storing the calibration model in a non-transitory memory in communication with the navigation system attached to the handle of the human-propelled wheeled cart.

9. The method of claim 8, wherein the 3-axis magnetic coil system comprises a magnetic coil having a break-apart that permits a portion of the magnetic coil to be separated, and wherein disposing the 3-axis magnetic coil system around the navigation system attached to the handle of the human-propelled wheeled cart comprises:
    opening the break-apart of the magnetic coil to permit the coil to surround the handle; and closing the break-apart prior to applying the time-varying currents to the 3-axis magnetic coil system.

10. A method for calibrating a magnetometer associated with a wheeled object, the method comprising:

disposing a magnetometer in a region surrounded by a first plurality of coils configured to generate a first magnetic field in a first direction, a second plurality of coils configured to generate a second magnetic field in a second direction, and a third plurality of coils configured to generate a third magnetic field in a third direction, each of the first, second, and third pluralities of coils configured to generate the respective first, second, and third magnetic fields in response to a first current, a second current, and a third current, respectively;

varying, by a controllable current source, each of the first current, the second current, and the third current;

measuring, by a hardware controller, the response of the magnetometer in response to the varied first, second, and third currents; and generating, by the hardware controller, a calibration model for the response of the magnetometer.

11. The method of claim 10, wherein the first plurality of coils, the second plurality of coils, or the third plurality of coils comprises a Helmholtz coil.

12. The method of claim 10, wherein the first plurality of coils, the second plurality of coils, or the third plurality of coils comprises a Maxwell coil.

13. The method of claim 10, wherein the second direction is perpendicular to the first direction, and the third direction is perpendicular to a plane containing the first direction and the second direction.

14. The method of claim 10, wherein disposing the magnetometer comprises disposing the magnetometer in a fixture designed such that the fixture can be placed in at least six different attitudes, such that each of three orthogonal axes of the magnetometer can be oriented in an upward direction and in a downward direction in one of the at least six attitudes.

15. The method of claim 10, wherein the magnetometer is disposed in an enclosure mounted to a handle of the wheeled object, the handle of the wheeled object defining a handle axis.

16. The method of claim 15, wherein the first direction is parallel to the handle axis, and wherein at least one coil in the first plurality of coils is designed to break apart so as to surround the handle of the wheeled object.

17. The method of claim 15, further comprising:

establishing an X-direction in a direction of motion of the wheeled object;

establishing a Y-direction perpendicular to the X-direction and in a horizontal plane of the wheeled object; and determining an orientation of the magnetometer relative to the X-direction and the Y-direction.

18. The method of claim 15, wherein generating the calibration model comprises generating a magnetic response model for the handle of the wheeled object.

19. The method of claim 10, wherein the wheeled object comprises a shopping cart.

20. The method of claim 10, further comprising providing the first, second, and third pluralities of coils in a fixed orientation in a clamshell that is designed to close around the magnetometer, such that the first, second, and third pluralities of coils are locked into a desired position relative to the magnetometer when the clamshell is closed.

21. The method of claim 10, wherein varying each of the first current, the second current, and the third current comprises using a feedback loop, a current sense amplifier, and an H-bridge for directional switching.

* * * * *